(12) United States Patent
Fu et al.

(10) Patent No.: US 7,462,926 B2
(45) Date of Patent: Dec. 9, 2008

(54) LEADFRAME COMPRISING TIN PLATING OR AN INTERMETALLIC LAYER FORMED THEREFROM

(75) Inventors: Ran Fu, Hong Kong (CN); Deming Liu, Hong Kong (CN); Yiu Fai Kwan, Hong Kong (CN)

(73) Assignee: ASM Assembly Automation Ltd., Hong Kong (CN)

( * ) Notice: Subject to any disclaimer, the term of this patent is extended or adjusted under 35 U.S.C. 154(b) by 103 days.

(21) Appl. No.: 11/293,711

(22) Filed: Dec. 1, 2005

(65) Prior Publication Data

US 2007/0126096 A1    Jun. 7, 2007

(51) Int. Cl.
H01L 23/495 (2006.01)
H01L 21/00 (2006.01)
B32B 15/00 (2006.01)

(52) U.S. Cl. .......... 257/677; 257/666; 257/E23.005; 257/E23.006; 257/E23.017; 257/E23.041; 257/E23.053; 257/E23.054; 438/111; 438/123; 428/644; 428/646; 428/655; 428/671; 428/674

(58) Field of Classification Search ......... 257/666–667, 257/E23.005–E23.009, E23.041, E23.053–E23.055; 438/111, 112, 123, FOR. 366, FOR. 367, 438/FOR. 377, FOR. 380, 643–695
See application file for complete search history.

(56) References Cited

U.S. PATENT DOCUMENTS

| | | | | |
|---|---|---|---|---|
| 4,055,062 A | * | 10/1977 | Martin et al. ............... | 72/47 |
| 4,065,625 A | * | 12/1977 | Iwai et al. ................... | 428/596 |
| 5,221,428 A | * | 6/1993 | Ohsawa et al. .............. | 216/14 |
| 5,436,082 A | * | 7/1995 | Mathew ...................... | 428/670 |
| 5,750,016 A | | 5/1998 | Moon .......................... | 205/50 |
| 2002/0192492 A1 | * | 12/2002 | Abys et al. .................. | 428/647 |
| 2004/0262719 A1 | * | 12/2004 | Seki et al. ................... | 257/666 |
| 2005/0242443 A1 | * | 11/2005 | Kobayashi .................. | 257/772 |

FOREIGN PATENT DOCUMENTS

| | | | | | |
|---|---|---|---|---|---|
| JP | 60-119765 | * | 6/1985 | ................ | 257/677 |
| JP | 60-143637 | * | 7/1985 | ................ | 257/766 |
| JP | 60-147148 | * | 8/1985 | ................ | 257/677 |
| JP | 2002-111188 | | 4/2002 | | |

OTHER PUBLICATIONS

English translation of Chinese Office Action for corresponding Chinese Application No. 2006-10145293.8 issued Apr. 11, 2008.

* cited by examiner

*Primary Examiner*—Jasmine J Clark
(74) *Attorney, Agent, or Firm*—Ostrolenk, Faber, Gerb & Soffen, LLP

(57) ABSTRACT

A method of producing a leadframe is provided, the method including the steps of providing a substrate, plating the substrate with a layer of tin, plating a layer of nickel over the layer of tin, and thereafter plating one or more protective layers over the layer of nickel. The leadframe may thereafter be heated to produce one or more intermetallic layers comprising tin, which impedes the out-diffusion of copper from a base material of the leadframe to the surface thereof.

16 Claims, 2 Drawing Sheets

| | |
|---|---|
| Gold layer | 20 |
| Palladium layer | 18 |
| Nickel layer | 16 |
| Tin layer | 14 |
| Substrate | 12 |

LEADFRAME COMPRISING TIN PLATING OR AN INTERMETALLIC LAYER FORMED THEREFROM

FIELD OF THE INVENTION

The invention relates to leadframes commonly used as carriers of semiconductor or integrated circuit chips during the production of semiconductor devices, and in particular to leadframes comprising multiple layers of plated material.

BACKGROUND AND PRIOR ART

In the manufacture of semiconductor devices, leadframes are commonly used as supports for mounting and processing a plurality of semiconductor dice or chips concurrently during what is generally referred to as semiconductor packaging. After a chip is mounted on a leadframe, electrical connections are made between the chip and the leadframe. The chip and part of the leadframe are then encased by plastic molding compound, such as epoxy molding compound (EMC) to form an electronic package. The molded electronic package may then be mounted to electrically connect the semiconductor chip to an external circuitry.

FIG. 1 is an elevation view of a leadframe device 100 that has been partially molded with an epoxy molding compound (EMC). The leadframe device 100 comprises a substrate, in the form of a leadframe 102, having a plurality of internal leads 104 for bonding a plurality of wires 106 to a chip 108. The chip 108 is mounted on a die pad 110, which is usually centrally located and surrounded by the internal leads 104. The wire-bonded leadframe is then packaged by encapsulation with EMC 112, which is shown partially molded onto the leadframe device 100. The encapsulation should seal off the plurality of internal leads 104, bonded wires 106, the chip 108 and the die pad 110 to protect the encapsulated material from environmental interference such as electromagnetic waves, contamination, and mechanical, thermal and electrical shock. The leadframe 102 further comprises a plurality of external leads 114 which are not sealed by EMC 112. After each unit of the encapsulated leadframe is separated from a carrier rail 116 by cutting, the plurality of external leads 114 may be formed into different shapes as required for connection to external devices.

As the semiconductor device comprises various components assembled together, the quality and reliability of the leadframe are important to achieve certain criteria, such as the bondability of internal leads 104 with bonding wires 106, the solderability of external leads 114 with external devices, and the adhesion of EMC 112 with the surfaces of the leadframe 102. To enhance quality and reliability, multiple coatings of material are typically plated onto leadframes. One form of these leadframes is commonly referred to as pre-plated leadframes (PPF). In a typical embodiment, PPFs comprise a base material such as copper (Cu) or a copper alloy, which is plated with a number of layers of different metals, such as nickel (Ni), and noble metals such as palladium (Pd) and gold (Au).

Since there is a worldwide trend for the elimination of lead (Pb) from semiconductor packaging, PPF technology is gaining increasing popularity as an environmentally-friendly technology. This is because PPF leadframes are plated with palladium (Pd) instead of silver (Ag) and tin/lead (Sn/Pb). Palladium is useful to protect the underlying plating layers and serves to promote bondability and solderability. The plating may cover the entire leadframe before the packaging process so that an automated packaging process could be carried out easily. A layer of nickel or nickel alloy is plated between the copper base material and the palladium layer to provide the leadframe with corrosion resistance by impeding the diffusion of copper to the surface of the leadframe. Copper reacts with air to form copper oxide, which adversely affects the quality and reliability of the leadframe.

FIG. 2 is a schematic sectional view of a three-layered pre-plated leadframe of the prior art. It shows a typical three-layered PPF or leadframe 120 comprising a substrate 122 made of a base material such as copper or a copper alloy.

A layer of nickel 124 is plated over the substrate 122 for impeding diffusion of copper from the base material. It is also the layer to which solders and wire bonds ultimately adhere.

Two layers comprising noble metals, such as palladium 126, followed by gold 128, are then plated in sequence to act as facilitators of wire bonding and soldering. They provide protection for the underlying nickel layer from oxidation and promote solderability owing to their fast diffusion into solders.

As manufacturers seek to make the plating layers ever-thinner to save costs, it is inevitably easier for the copper base material to out-diffuse to the surface of the leadframe through material defects such as inherent porosity in the form of pin-holes and grain boundaries. In FIG. 2, the migration of copper from the substrate 122 to the surface of the three-layered leadframe 120 is shown. When the diffused copper 130 reaches the surface of the leadframe 120, it will oxidize upon contact with the ambient air. As a result, degradation of wire bondability and solderability occurs on the surface of the leadframe 120.

Despite its favorable properties, the use of nickel increases the cost of manufacturing such leadframes in terms of both raw materials and production cycle time. Another benefit from reducing nickel thickness is that a thinner nickel layer tends to promote increased surface roughness of the base leadframe, which is usually deliberately introduced to enhance the adhesion of EMC to the leadframe. However, if the use of nickel is reduced, reliability issues arise because of degradation of bondability and solderability due to increased diffusion of copper to the surface of the leadframe. Accordingly, the invention seeks to reduce at least the use of nickel in the plating layers by introducing an additional obstacle separating the base material and nickel layer to impede the out-diffusion of copper from the base material through the multiple plating layers.

SUMMARY OF THE INVENTION

It is an object of the invention to seek to provide a pre-plated leadframe comprising one of more layers of tin-bearing intermetallic layers, so as to impede migration of the base material of the leadframe to an outer surface thereof.

According to a first aspect of the invention, the invention provides a method of producing a leadframe, comprising the steps of: providing a substrate; plating the substrate with a layer of tin; plating a layer of nickel over the layer of tin; and thereafter plating one or more protective layers over the layer of nickel.

According to a second aspect of the invention, the invention provides a leadframe comprising: a substrate; a layer of nickel over the substrate; a layer of tin between the substrate and the layer of nickel; and one or more protective layers over the layer of nickel.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a leadframe in accordance with the invention will now be described with reference to the accompanying drawings, in which.

DETAILED DESCRIPTION OF THE PREFERRED EMBODIMENT

Figure 1:
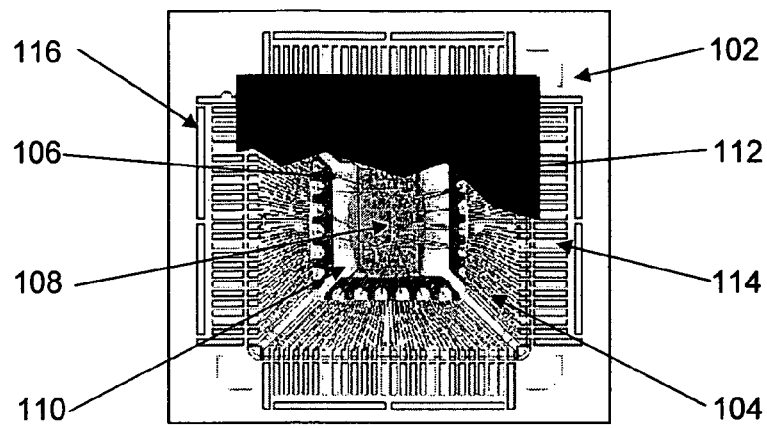
FIG. 1 is a top view of a leadframe device that has been partially molded with an epoxy molding compound (EMC)
Figure 2:
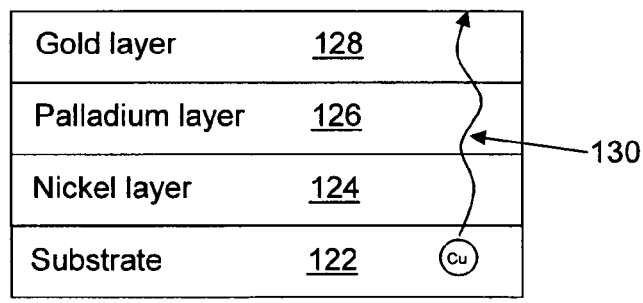
FIG. 2 is a schematic sectional view of a three-layered pre-plated leadframe of the prior art.
Figure 3:
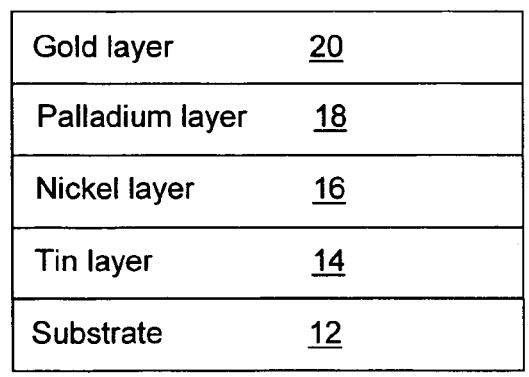
FIG. 3 is a schematic sectional view of a pre-plated leadframe used as a substrate for semiconductor packaging with a layer of tin plated between a copper base material and a nickel layer according to the preferred embodiment of the invention.

Referring to the drawings in which like parts are referred to by like numerals, FIG. 3 is a schematic sectional view of a pre-plated leadframe 10 used as a substrate for semiconductor packaging with a layer of tin plated between a copper base material and nickel layer according to the preferred embodiment of the invention.

The pre-plated leadframe 10 comprises a substrate 12 on which multiple layers of material are plated. The substrate 12 comprises a base material, made preferable of copper or a copper alloy. A layer of tin 14 is plated over the substrate 12 and it has a thickness of preferably less than 20 nm. More preferably, the thickness of the layer of tin is less than 5 nm.

A layer of nickel 16 is then plated over the layer of tin 14 and it has a thickness of preferably between 50 nm to 250 nm. One or more protective layers, preferably comprising noble metals, should be plated over the layer of nickel 16. In the illustrated embodiment, a layer comprised of a first noble metal, such as palladium 18, is plated over the layer of nickel 16 and it has a thickness of preferably between 1 nm to 50 nm. Lastly, a layer comprised of a second noble metal, such as gold 20, is then plated over the layer of palladium 18 and it has a thickness of preferably between 1 nm to 50 nm.

By heating the aforementioned leadframe 10 that is so plated with the respective plating layers as described at an elevated temperature, the layer of tin 14 between the substrate 12 and the layer of nickel 16 starts to form one or more intermetallic layers at the interfaces between the layer of tin 14 and the substrate 12, and between the layer of tin 14 and the layer of nickel 16 respectively. Generally, a higher temperature would speed up the formation of the one or more intermetallic layers.

Figure 4:
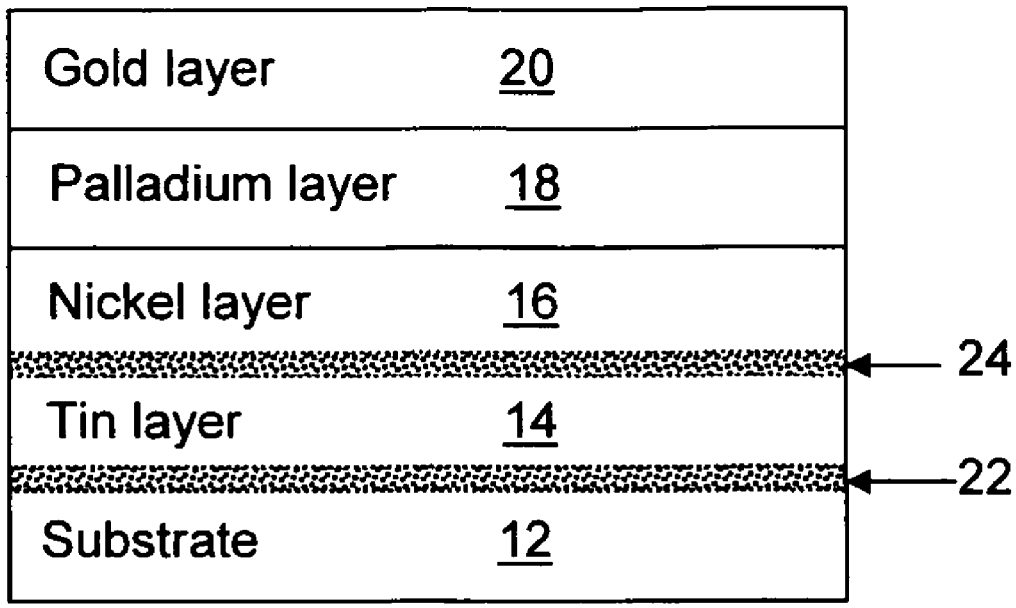
FIG. 4 is a schematic sectional view of the pre-plated leadframe of FIG. 3 with intermetallic layers formed between the layer of tin and the substrate, and between the layer of tin and the layer of nickel.

FIG. 4 is a schematic sectional view of a pre-plated leadframe 10 with a first intermetallic layer 22 formed between the layer of tin 14 and the substrate 12, and a second intermetallic layer 24 formed between the layer of tin 14 and the layer of nickel 16. The first intermetallic layer 22 primarily comprises copper-tin compounds, such as $Cu_3Sn$ and $Cu_6Sn_5$, formed between the substrate 12 and the layer of tin 14. On the other hand, the second intermetallic layer 24 primarily comprises nickel-tin compounds, such as $Ni_3Sn_4$, formed between the layer of tin 14 and the layer of nickel 16. In between, there may be a layer of tin 14 that remains unreacted.

As a result, the interlayer between the substrate 12 and the layer of nickel 16 may comprise a laminated structure consisting of tin and separate layers of intermetallic compounds of different compositions. Nevertheless, one should note that this would likely occur only where the layer of tin 14 is sufficiently thick to be able to accommodate separately identifiable first and second intermetallic layers 22, 24.

Figure 5:
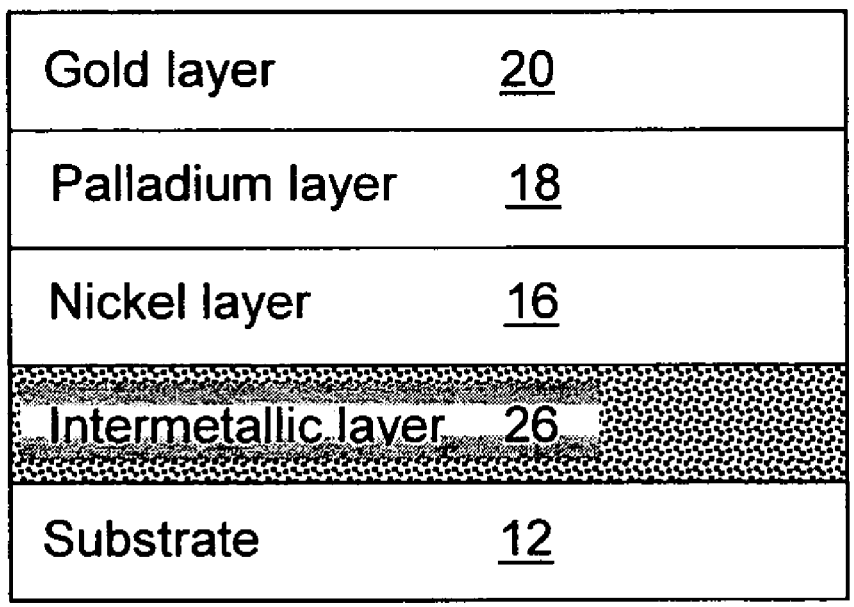
FIG. 5 is a schematic sectional view of the pre-plated leadframe with a single intermetallic layer formed between the substrate and the layer of nickel.

FIG. 5 is a schematic sectional view of a pre-plated leadframe 10 with a single intermetallic layer 26 formed between the substrate 12 and the layer of nickel 16. The intermetallic layer 26 comprises copper-tin compounds, such as $Cu_3Sn$, $Cu_6Sn_5$, and nickel-tin compounds, such as $Ni_3Sn_4$, formed between the substrate 12 and the layer of nickel 16. Additionally, a ternary compound, such as $(Cu, Ni)_6Sn_5$ may be present. Thus, the intermetallic layer comprises compounds selected from the group consisting of $Cu_3Sn$, $Cu_6Sn_5$, $Ni_3Sn_4$ as well as $(Cu, Ni)_6Sn_5$.

In practice, a single layer of tin-bearing intermetallic compounds may be deliberately formed between the substrate 12 and layer of nickel 16 with a proper combination of parameters such as controlling the thickness of the tin layer, process temperature and time. Referring to FIG. 4, the intermetallic layers 22, 24 will typically grow when the leadframe is further heated, and they will tend to engulf the layer of tin 14. Finally, a single layer of a tin-bearing intermetallic compound is formed. Alternatively, if the tin plating is sufficiently thin, such as less than 5 nm thick, a single intermetallic layer 26 may be formed directly without the formation of separate interfacial intermetallic layers 22, 24. The resultant intermetallic layer is variable in thickness depending on the heating temperature and time, but is generally thicker than the layer of tin that was initially plated.

Heating of the plated substrate or leadframe may either be a separate process incorporated during leadframe manufacturing or inherent with one or more of the packaging processes. For example, heating of the leadframe is almost inevitably performed during die bonding, wire bonding and molding processes, and the heating processes therein may be sufficient to result in formation of the one or more intermetallic layers herein described. Therefore, in the production and use of these leadframes according to the preferred embodiment of the invention, it is not necessary to first create the one or more intermetallic layers with heat treatment before shipment and use of the leadframes. The formation of one or more intermetallic layers can take place as either as part of the leadframe manufacturing process, or as part of the packaging process, resulting in more versatility, convenience and choice.

An advantage of this new approach is that the layer of tin may be formed as a very thin layer (most preferably with a thickness of less than 5 nm), thereby promoting the formation of ternary $(Cu, Ni)_6Sn_5$ or other tin-based intermetallic compounds which are dense and uniform along the interface. The dense, uniform, though very thin, intermetallic interfacial layer acts as an effective diffusion barrier in addition to the multiple plating layers above it, namely the nickel, palladium and gold layers. As such, diffusion of copper to the surface of the leadframe would be largely reduced.

To verify the benefits of the pre-plated leadframe 10 produced according to the preferred embodiment of the invention, an industry adopted porosity test was performed on it and the result was compared with that of a control leadframe 120 of the prior art. The leadframes were heated at a temperature of 450° C. for 5 minutes to promote the diffusion of copper in the tested leadframes. The leadframes that were so heated were then immersed into sulfuric acid and the amount of copper dissolved in the acid was thereafter measured. Higher levels of copper dissolved in the sulfuric acid imply a greater amount of copper diffusing to the surface of the leadframe.

Using a first set of substrates (referred to as "Type-A Leadframes"), a layer of tin with less than 5 nm thickness was formed on the substrates in accordance with the preferred embodiment of the invention. A leadframe of the prior art was used as a control, and it has comparable thickness in relation to the respective nickel, palladium, and gold layers. Table 1 shows the result of porosity tests conducted for both leadframes.

TABLE 1

| Leadframe | Tin | Nickel | Palladium | Gold | Amount of Cu dissolved |
|---|---|---|---|---|---|
| Type-A Leadframes | <5 nm | 207 nm | 10.0 nm | 2.1 nm | 6.2 µg/cm$^2$ |
| Prior art Leadframes (control) | Nil | 232 nm | 10.5 nm | 2.3 nm | 22.8 µg/cm$^2$ |

The experiment was repeated on another set of substrates (referred to as "Type-B Leadframes") that were similarly plated according to the preferred embodiment of the invention, the test result is given in Table 2.

TABLE 2

| Leadframe | Tin | Nickel | Palladium | Gold | Amount of Cu dissolved |
|---|---|---|---|---|---|
| Type-B Leadframes | <5 nm | 251 nm | 12.4 nm | 2.5 nm | 5.3 µg/cm$^2$ |
| Prior art Leadframe (control) | Nil | 265 nm | 14.2 nm | 2.5 nm | 18.0 µg/cm$^2$ |

The thicknesses of the substrates shown in Table 1 and Table 2 were obtained from an average of a total of six measurements made at three typical locations for each leadframe.

The mass of copper dissolved in the sulfuric acid from the type-A and type-B leadframes amounts to less than one third of that for the control leadframe 120, indicating that the integrity of the multiple layers on the pre-plated leadframe 10 is remarkably enhanced as compared to the prior art counterpart. This is achievable by the sole introduction of a thin layer of tin and thereafter forming the resultant tin-bearing intermetallic layers in-between the copper and nickel layers.

In other tests conducted on the respective leadframes, it was verified that the pre-plated leadframes 10 according to the invention can pass bondability and solderability criteria used in the manufacture of pre-plated leadframes, even though they have a significantly reduced amount of nickel. For example, it was found that the thickness of the nickel plating can be reduced from about 500 nm in typical leadframes meeting industrially-required standards, to less than 250 nm, simply with additional of the layer of tin that is adapted to form one or more intermetallic layers. Although depending on the constitution of the copper alloy in the base material, the thickness of the layer of nickel may vary from 50 nm to 750 nm, the layer of nickel can be substantially reduced by using the method according to the preferred embodiment of the invention, as compared to the prior art methods. Savings can therefore be made both in terms of the cost of plating material used as well as cycle time. Higher surface conformity to base roughness is also easier to achieve by plating a thinner layer of nickel, so as to promote adhesion of EMC to the leadframe. With its obvious cost and other advantages, pre-plated leadframes 10 according to the preferred embodiment of the invention may replace prior art leadframes 120 that are now generally in use.

The invention described herein is susceptible to variations, modifications and/or additions other than those specifically described and it is to be understood that the invention includes all such variations, modifications and/or additions which fall within the spirit and scope of the above description.

The invention claimed is:

1. A method of producing a leadframe, comprising the steps of:
    providing a substrate comprised of copper or copper alloy;
    plating the substrate with a layer of tin;
    plating a layer of nickel over the layer of tin;
    plating one or more protective layers over the layer of nickel; and
    thereafter, forming one or more intermetallic layers comprised of tin between the substrate and the layer of nickel.

2. The method as claimed in claim 1 wherein the heating the plated substrate is conducted during a semiconductor packaging process including heating the leadframe.

3. The method as claimed in claim 2 wherein the heating the plated substrate is conducted during a semiconductor packaging process including heating the leadframe.

4. The method as claimed in claim 1 wherein the intermetallic layers comprise compounds selected from a group consisting of: Cu3Sn, Cu6SnS, NbSn4 and (Cu,Ni)6SnS.

5. The method as claimed in claim 1 wherein the layer of tin is plated to a thickness of less than 20 nm.

6. The method as claimed in claim 5 wherein the layer of tin is plated to a thickness of less than 5 nm.

7. The method as claimed in claim 1 wherein the layer of nickel is plated to a thickness of between 50 nm to 750 nm.

8. The method as claimed in claim 1 wherein the one or more protective layers comprises a layer of palladium plated to a thickness of between 1 nm to 50 nm.

9. The method as claimed in claim 8 wherein the one or more protective layers further comprises a layer of gold over the layer of palladium and the gold layer having a thickness of between 1 nm to 50 nm.

10. A leadframe comprising:
    a substrate comprised of copper or copper alloy;
    a layer of nickel over the substrate;
    a layer of tin between the substrate and the layer of nickel;
    one or more protective layers over the layer of nickel; and
    one or more intermetallic layers between the substrate and the layer of nickel formed by reaction between the tin in the substrate and the layer of nickel.

11. The leadframe as claimed as claimed in claim 10 wherein the one or more intermetallic layers comprise compounds selected from a group consisting of: Cu3Sn, Cu6SnS, Ni3Sn4 and (Cu,Ni)6SnS.

12. The leadframe as claimed in claim 10 wherein the layer of tin has a thickness of less than 20 nm.

13. The leadframe as claimed in claim 12 wherein the layer of tin has a thickness of less than 5 nm.

14. The leadframe as claimed in claim 10 wherein the layer of nickel has a thickness of between 50 to 750 nm.

15. The leadframe as claimed in claim 10 wherein the one or more protective layers comprises a layer of palladium having a thickness of between 1 nm to 50 nm.

16. The leadframe as claimed in claim 15 wherein the one or more protective layers further comprises a layer of gold over the layer of palladium and the gold layer having a thickness of between 1 nm to 50 nm.

* * * * *